(12) United States Patent
Lee

(10) Patent No.: US 11,374,543 B2
(45) Date of Patent: Jun. 28, 2022

(54) AMPLIFIER SYSTEM WITH REDUCED VOLTAGE SWING

(71) Applicant: SKYWORKS SOLUTIONS, INC., Irvine, CA (US)

(72) Inventor: Yong Hee Lee, Tustin, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 124 days.

(21) Appl. No.: 17/008,394

(22) Filed: Aug. 31, 2020

(65) Prior Publication Data

US 2021/0067111 A1 Mar. 4, 2021

Related U.S. Application Data

(60) Provisional application No. 62/895,743, filed on Sep. 4, 2019.

(51) Int. Cl.
| | |
|---|---|
| *H03F 3/24* | (2006.01) |
| *H03F 1/02* | (2006.01) |
| *H03G 3/30* | (2006.01) |
| *H04B 1/3827* | (2015.01) |

(52) U.S. Cl.
CPC ........... *H03F 3/245* (2013.01); *H03F 1/0288* (2013.01); *H03G 3/3042* (2013.01); *H04B 1/3827* (2013.01); *H03F 2200/294* (2013.01); *H03F 2200/435* (2013.01); *H03F 2200/451* (2013.01); *H03G 2201/103* (2013.01); *H03G 2201/307* (2013.01)

(58) Field of Classification Search
CPC ...................................................... H03F 3/245
See application file for complete search history.

(56) References Cited

U.S. PATENT DOCUMENTS

| | | | | |
|---|---|---|---|---|
| 6,359,504 | B1* | 3/2002 | Cozzarelli | H03F 1/3229 330/136 |
| 2004/0189381 | A1* | 9/2004 | Louis | H03F 3/602 330/124 R |
| 2006/0006945 | A1* | 1/2006 | Burns | H03F 3/211 330/295 |
| 2009/0074407 | A1* | 3/2009 | Hornbuckle | H04B 10/5561 398/43 |
| 2010/0033243 | A1* | 2/2010 | Okazaki | H03F 3/2176 330/124 R |
| 2011/0140772 | A1* | 6/2011 | Sengupta | H03F 1/223 703/14 |

\* cited by examiner

*Primary Examiner* — Patricia T Nguyen
(74) *Attorney, Agent, or Firm* — Lando & Anastasi, LLP

(57) ABSTRACT

According to one aspect, embodiments of the invention provide an amplifier system comprising a first phase shifter configured to generate, based on an input signal, a first signal and a second signal, the second signal being out of phase with the first signal, a first amplifier configured to apply a first gain to the first signal to produce a gain adjusted first signal, a second amplifier configured to apply a second gain to the second signal to produce a gain adjusted second signal, a second phase shifter configured to combine the gain adjusted first and second signals to produce an output signal, and a controller configured to identify a high voltage swing across the first amplifier and, in response to identifying the high voltage swing, adjust the first gain to reduce output power of the first amplifier and adjust the second gain to increase output power of the second amplifier.

20 Claims, 4 Drawing Sheets

AMPLIFIER SYSTEM WITH REDUCED VOLTAGE SWING

CROSS-REFERENCE TO RELATED APPLICATIONS

This application claims priority under 35 U.S.C. § 119(e) to U.S. Provisional Patent Application Ser. No. 62/895,743 titled "AMPLIFIER SYSTEM WITH REDUCED VOLTAGE SWING", filed Sep. 4, 2019 which is incorporated herein in its entirety for all purposes.

BACKGROUND

In conventional RF front-end systems, it is generally desired to match the output impedance of an amplifier module with the load impedance of a corresponding antenna such that reflections from the antenna are reduced or eliminated. Reflections from the antenna to the amplifier module, and resulting standing waves, can impact the behavior of power amplifiers in the amplifier module and reduce efficiency of the power amplifiers.

FIG. 1 is a block diagram illustrating an example of a typical arrangement of a Radio-Frequency (RF) "front-end" sub-system or module (FEM) 100 as may be used in a communications device, such as a mobile phone, for example, to transmit RF signals. The FEM 100 shown in FIG. 1 includes a transmit path (TX) configured to provide signals to an antenna for transmission; however, the FEM 100 may also include a receive path (RX) configured to process signals received by the antenna. In the transmit path (TX), a power amplifier module 110 provides gain to an RF signal 105 input to the FEM 100 via an input port 101, producing an amplified RF signal. The power amplifier module 110 can include one or more Power Amplifiers (PA). The FEM 100 can further include a filtering sub-subsystem or module 120, which can include one or more filters. A directional coupler 130 can also be used to extract a portion of the power from the RF signal traveling between the power amplifier module 110 and an antenna 140 connected to the FEM 100. The antenna 140 can transmit the RF signal and can also receive RF signals. A switching circuit 150, also referred to as an Antenna Switch Module (ASM), can be used to switch between a transmitting mode and receiving mode of the FEM 100, for example, or between different transmit or receive frequency bands. The switching circuit 150 can be operated under the control of a controller 160. The FEM 100 may also include one or more Low-Noise Amplifiers (LNA).

SUMMARY

An amplifier system is described herein that applies asymmetric power distribution to account for undesired voltage swings. At least one aspect of the invention is directed to an amplifier system comprising an input configured to be coupled to a source and to receive an input signal from the source, a first phase shifter configured to generate, based on the input signal, a first signal and a second signal, the second signal being out of phase with the first signal, a first amplifier coupled to the first phase shifter and configured to apply a first gain to the first signal to produce a gain adjusted first signal, a second amplifier coupled to the first phase shifter and configured to apply a second gain to the second signal to produce a gain adjusted second signal, a second phase shifter coupled to the first amplifier and the second amplifier and configured to combine the gain adjusted first signal and the gain adjusted second signal to produce an output signal, and a controller coupled to the first amplifier and the second amplifier and configured to identify a high voltage swing across the first amplifier and, in response to identifying the high voltage swing across the first amplifier, adjust the first gain of the first amplifier to reduce output power of the first amplifier and adjust the second gain of the second amplifier to increase output power of the second amplifier.

According to one embodiment, the amplifier system further comprises a first peak detector coupled to the first amplifier and configured to monitor voltage peaks of the gain adjusted first signal. In one embodiment, the controller is further configured to identify the high voltage swing across the first amplifier based on the monitored voltage peaks of the gain adjusted first signal.

According to another embodiment, the controller is further configured to identify a high voltage swing across the second amplifier and, in response to identifying the high voltage swing across the second amplifier, adjust the second gain of the second amplifier to reduce output power of the second amplifier and adjust the first gain of the first amplifier to increase output power of the first amplifier. In one embodiment, the controller is further configured to adjust the first gain and the second gain to maintain a power level of the output signal at a substantially constant level.

According to one embodiment, the amplifier system further comprises a first peak detector coupled to the first amplifier and configured to monitor voltage peaks of the gain adjusted first signal, and a second peak detector coupled to the second amplifier and configured to monitor voltage peaks of the gain adjusted second signal. In one embodiment, the controller is further configured to identify the high voltage swing across the first amplifier based on the monitored voltage peaks of the gain adjusted first signal and to identify the high voltage swing across the second amplifier based on the monitored voltage peaks of the gain adjusted second signal. In another embodiment, the second signal is ninety degrees out of phase with the first signal.

Another aspect of the invention is directed to a front-end module for a wireless device comprising an input port configured to receive an input Radio Frequency (RF) signal, a power amplifier module coupled to the input port and including an input configured to be coupled to the input port and to receive the input RF signal, a first phase shifter configured to generate, based on the input RF signal, a first signal and a second signal, the second signal being out of phase with the first signal, a first amplifier coupled to the first phase shifter and configured to apply a first gain to the first signal to produce a gain adjusted first signal, a second amplifier coupled to the first phase shifter and configured to apply a second gain to the second signal to produce a gain adjusted second signal, a second phase shifter coupled to the first amplifier and the second amplifier and configured to combine the gain adjusted first signal with the gain adjusted second signal to produce a first RF signal, and a controller coupled to the first amplifier and the second amplifier and configured to identify a high voltage swing across the first amplifier and, in response to identifying the high voltage swing across the first amplifier, adjust the first gain of the first amplifier to reduce output power of the first amplifier and adjust the second gain of the second amplifier to increase output power of the second amplifier, and an output configured to be coupled to an antenna, to receive a second RF signal from the antenna in a receive mode of operation, and to transmit the first RF signal from the power amplifier module to the antenna in a transmit mode of operation;

According to one embodiment, the front-end module further comprises a first peak detector coupled to the first amplifier and configured to monitor voltage peaks of the gain adjusted first signal. In one embodiment, the controller is further configured to identify the high voltage swing across the first amplifier based on the monitored voltage peaks of the gain adjusted first signal.

According to another embodiment, the controller is further configured to identify a high voltage swing across the second amplifier and, in response to identifying the high voltage swing across the second amplifier, adjust the second gain of the second amplifier to reduce output power of the second amplifier and adjust the first gain of the first amplifier to increase output power of the first amplifier. In one embodiment, the controller is further configured to adjust the first gain and the second gain to maintain a power level of the output signal at a substantially constant level.

According to one embodiment, the front-end module further comprises a first peak detector coupled to the first amplifier and configured to monitor voltage peaks of the gain adjusted first signal, and a second peak detector coupled to the second amplifier and configured to monitor voltage peaks of the gain adjusted second signal. In one embodiment, the controller is further configured to identify the high voltage swing across the first amplifier based on the monitored voltage peaks of the gain adjusted first signal and to identify the high voltage swing across the second amplifier based on the monitored voltage peaks of the gain adjusted second signal. In another embodiment, the second signal is ninety degrees out of phase with the first signal.

At least one aspect of the invention is directed to a wireless device comprising a transceiver configured to produce a transmit signal, a power amplifier module coupled to the transceiver and including, an input configured to be coupled to the transceiver and to receive the transmit signal, a first phase shifter configured to generate, based on the transmit signal, a first signal and a second signal, the second signal being out of phase with the first signal, a first amplifier coupled to the first phase shifter and configured to apply a first gain to the first signal to produce a gain adjusted first signal, a second amplifier coupled to the first phase shifter and configured to apply a second gain to the second signal to produce a gain adjusted second signal, a second phase shifter coupled to the first amplifier and the second amplifier and configured to combine the gain adjusted first signal with the gain adjusted second signal to produce a first RF signal, and a controller coupled to the first amplifier and the second amplifier and configured to identify a high voltage swing across the first amplifier and, in response to identifying the high voltage swing across the first amplifier, adjust the first gain of the first amplifier to reduce output power of the first amplifier and adjust the second gain of the second amplifier to increase output power of the second amplifier, and an antenna configured to receive a second RF signal in a receive mode of operation and to transmit the first RF signal from the power amplifier in a transmit mode of operation;

According to one embodiment, the wireless device further comprises a first peak detector coupled to the first amplifier and configured to monitor voltage peaks of the gain adjusted first signal. In one embodiment, the controller is further configured to identify the high voltage swing across the first amplifier based on the monitored voltage peaks of the gain adjusted first signal.

According to another embodiment, the controller is further configured to identify a high voltage swing across the second amplifier and, in response to identifying the high voltage swing across the second amplifier, adjust the second gain of the second amplifier to reduce output power of the second amplifier and adjust the first gain of the first amplifier to increase output power of the first amplifier. In one embodiment, the controller is further configured to adjust the first gain and the second gain to maintain a power level of the output signal at a substantially constant level.

According to one embodiment, the wireless device further comprises a first peak detector coupled to the first amplifier and configured to monitor voltage peaks of the gain adjusted first signal, and a second peak detector coupled to the second amplifier and configured to monitor voltage peaks of the gain adjusted second signal. In one embodiment, the controller is further configured to identify the high voltage swing across the first amplifier based on the monitored voltage peaks of the gain adjusted first signal and to identify the high voltage swing across the second amplifier based on the monitored voltage peaks of the gain adjusted second signal. In another embodiment, the second signal is ninety degrees out of phase with the first signal.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
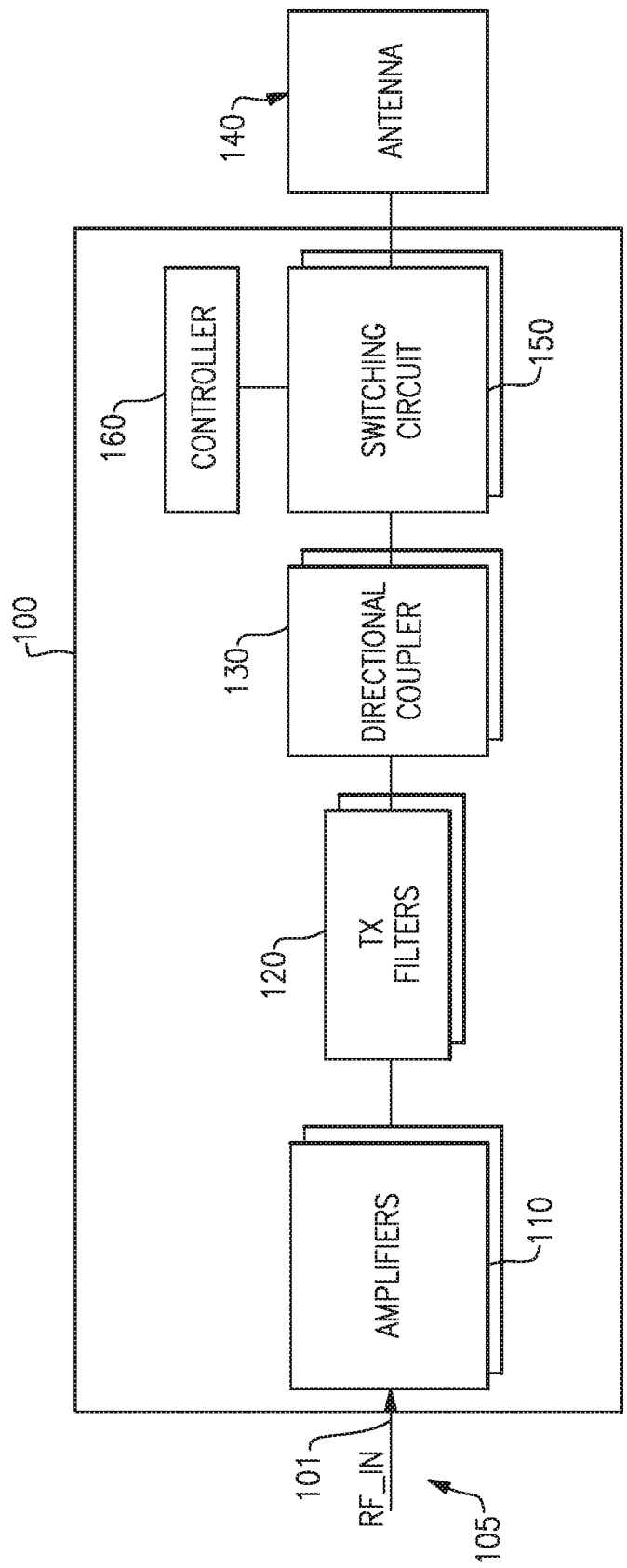
FIG. 1 is a block diagram of one example of a conventional RF front-end system.

As discussed above, in conventional RF front-end systems (e.g., as shown in FIG. 1), it is generally desired to match the output impedance of the amplifier module 110 with the load impedance of the antenna 140 such that reflections from the antenna are reduced or eliminated and maximum power is transferred from the amplifier module 110 to the antenna. A mismatch between the output impedance of the amplifier module 110 and the load impedance of the antenna 140 due to a change in properties of the antenna 140 (for example, such as the antenna being located on top of a metal surface) can result in reflections from the antenna 140 to the amplifier module 110. Reflections from the antenna 140 to the amplifier module 110, and resulting standing waves, can impact the behavior of power amplifiers in the amplifier module 110 and reduce efficiency of the power amplifiers.

For example, a high voltage standing wave ratio (VSWR) condition resulting from an impedance mismatch can lead to high voltage swings across an amplifier in the amplifier module 110 that can damage the amplifier. If the amplifier is a complementary metal-oxide-semiconductor (CMOS) amplifier having a relatively low breakdown voltage, the high voltage swings will likely damage the amplifier. In traditional amplifier systems, such large voltage swings can be reduced by turning down (i.e., reducing) the output power of the corresponding amplifier or utilizing a power monitoring circuit that limits output power of the amplifier. However, a reduction in output power of the amplifier can make successful operation of the associated RF front-end system difficult.

An amplifier system is described herein that applies asymmetric power distribution to account for undesired voltage swings. For example, the balanced amplifier system described herein includes two amplifiers that are configured to see opposite sides of the load impedance such that when the first amplifier has a high voltage swing due to high load impedance, the second amplifier has a low voltage swing due to low load impedance. A power detector is coupled to each amplifier to monitor the voltage swing of each amplifier. When a high voltage swing is detected in one of the amplifiers, the power of the amplifier with the high voltage swing is reduced and the power of the amplifier with low voltage swing is increased. Accordingly, the level of total output power of the system can be maintained at a desired level while also reducing voltage swing across the amplifier system. By reducing voltage swing across the amplifier system, damage of the amplifier system can be prevented.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 2:
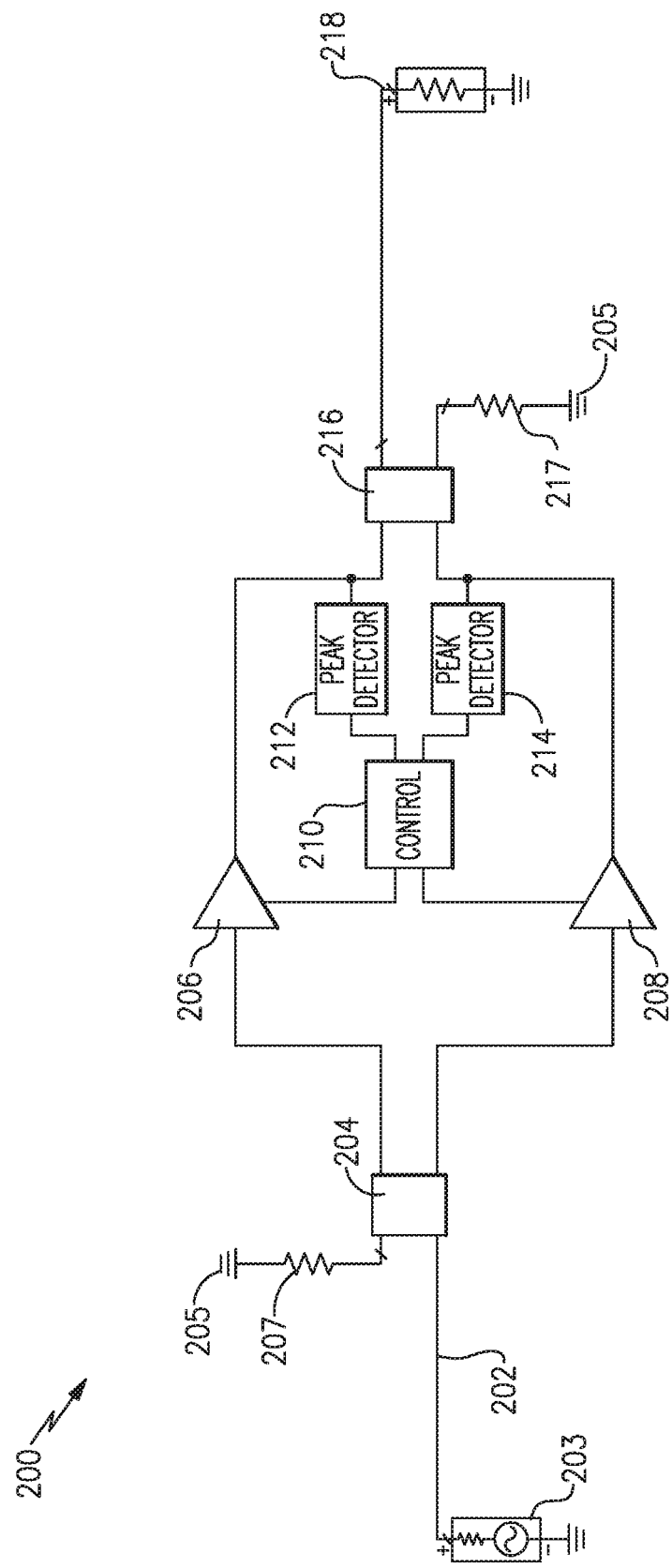
FIG. 2 is a schematic diagram of one embodiment of an amplifier system according to aspects described herein.

FIG. 2 is a circuit diagram of one embodiment of an amplifier system 200 as described herein. According to one embodiment, the amplifier system 200 is included in the amplifier module 110 of the FEM 100; however, in other embodiments, the amplifier module can be included in a different system. The amplifier system 200 includes an input 202, a first phase shifter 204, a first amplifier 206, a second amplifier 208, a controller 210, a first peak detector 212, a second peak detector 214, a second phase shifter 216, and an output 218. According to one embodiment, the first amplifier 206 and the second amplifier 208 are complementary metal-oxide-semiconductor (CMOS) transistor-based amplifiers; however, in other embodiments, different types of transistors/amplifiers can be utilized.

The input 202 of the amplifier system 200 is configured to be coupled to a source 203 of a signal (e.g., the input port 101 of the FEM 100). According to a least one embodiment, the first phase shifter 204 is coupled to the input 202, the input of the first amplifier 206, and the input of the second amplifier 208. The first phase shifter 204 is also coupled to ground 205 via a first resistor 207. The output of the first amplifier 206 and the output of the second amplifier 208 is coupled to the second phase shifter 216. The input of the first peak detector 212 is coupled to the output of the first amplifier 206. The output of the first peak detector 212 is coupled to the controller 210. The input of the second peak detector 214 is coupled to the output of the second amplifier 208. The output of the second peak detector 214 is coupled to the controller 210. The controller 210 is also coupled to the first amplifier 206 and the second amplifier 208. The second phase shifter 216 is also coupled to the output 218, and coupled to ground 205 via a second resistor 217. Operation of the system 200 is discussed below.

The input 202 receives an input signal from the source 203 (e.g., an input RF signal meant for transmission via the antenna 140 of the FEM 100). The received input RF signal is provided to the first phase shifter 204 and the first phase shifter 204 operates to split the input RF signal into a first signal, provided to the first amplifier 206, and a second signal, provided to the second amplifier 208. The first phase shifter 204 generates the first and second signals such that the second signal is 90 degrees out of phase with the first signal. For example, the first signal may have the same phase as the input RF signal and the second signal may be shifted by 90 degrees relative to the input RF signal (and the first signal). The controller 210 operates the first amplifier 206 to amplify the first signal at a first gain and the second amplifier 208 to amplify the second signal at a second gain. The gain adjusted signals from the first amplifier 206 and the second amplifier 208 are provided to the second phase shifter 216. The second phase shifter 216 applies a 90 degree phase shift to one of the gain adjusted signals, combines the amplified signals from the first amplifier 206 and the second amplifier 208, and provides a resulting output RF signal to the output 218.

The first peak detector 212 monitors the output of the first amplifier 206 and the second peak detector 214 monitors the output of the second amplifier 208. The first peak detector 212 provides an indication of the peak voltage level of the output of the first amplifier 206 to the controller 210. The second peak detector 214 provides an indication of the peak voltage level of the output to the second amplifier 208 to the controller 210. Based on the information received from the first peak detector 212 and the second peak detector 214, the controller 210 can adjust the gains of the first amplifier 206 and the second amplifier 208 to provide asymmetric power distribution to account for identified voltage swings.

In a matched condition (e.g., where the output impedance of the amplifier system 200 is matched with the load impedance of a corresponding antenna), the output signal of the first amplifier 206 will be substantially the same as the output signal of the second amplifier 208 (and the peak voltage levels will also be substantially the same), except that the signals will be out of phase by 90 degrees. In such a condition, the controller 210 operates the first amplifier 206 and the second amplifier 208 in a balanced condition where each amplifier 206, 208 applies the same gain.

As described above, the second signal output by the second amplifier 208 is 90 degrees out of phase with the first signal output by the first amplifier 306, and the first amplifier 208 and second amplifier 208 see opposite sides of load impedance at the output 218. As such, changes in the output impedance of the system 200 will impact each amplifier differently. For example, in at least one embodiment where the impedance at the output 218 of the system increases (e.g., due to an impedance mismatch), the peak voltage of the signal output by the first amplifier 206 increases and the peak voltage of the signal output by the second amplifier 208 decreases. High voltage swings across the first amplifier 206 can damage the amplifier or another component of the system 200. As such, upon sensing a high voltage swing across the first amplifier 206 (through an increase in peak voltage sensed by the first peak detector 212), the controller 210 can operate the system 200 to apply asymmetric power distribution to account for the identified voltage swing.

For example, when the controller 210 identifies a high voltage swing (i.e., increasing peak voltage sensed by the first peak detector 212 above a peak threshold level) across the first amplifier 206, the controller 210 adjusts the gain of the first amplifier to reduce the output power of the first amplifier 206 and adjusts the gain of the second amplifier 208 to increase the output power of the second amplifier 208. By reducing the output power of the first amplifier 206 and increasing the output power of the second amplifier 208, the level of output power provided by the system 200 (after the signals from the amplifiers 206, 208 are combined by the second phase shifter 216) is maintained at a desired level while also reducing the voltage swing across the first amplifier 206. By reducing voltage swings across the amplifier system, as described above, damage of the amplifier system can be prevented while maintaining output power of the amplifier system at the desired level.

In another embodiment where the impedance at the output 218 of the system decreases (e.g., due to an impedance mismatch), the peak voltage of the signal output by the second amplifier 208 increases and the peak voltage of the signal output by the first amplifier 206 decreases. High voltage swings across the second amplifier 208 can damage the amplifier or another component of the system 200. As such, upon sensing a high voltage swing across the second amplifier 208 (through an increase in peak voltage sensed by the second peak detector 214), the controller 210 can operate the system 200 to apply asymmetric power distribution to account for the identified voltage swing.

For example, when the controller 210 identifies a high voltage swing (i.e., increasing peak voltage sensed by the second peak detector 214 above a peak threshold level) across the second amplifier 208, the controller 210 adjusts the gain of the second amplifier 208 to reduce the output power of the second amplifier 208 and adjusts the gain of the first amplifier 206 to increase the output power of the first amplifier 206. By reducing the output power of the second amplifier 208 and increasing the output power of the first amplifier 206, the level of output power provided by the system 200 (after the signals from the amplifiers 206, 208 are combined by the second phase shifter 216) is maintained at a desired level while also reducing voltage swing across the second amplifier 208. By reducing voltage swing across the amplifier system, as described above, damage of the amplifier system can be prevented while maintaining output power of the amplifier system at a desired level.

Figure 3:
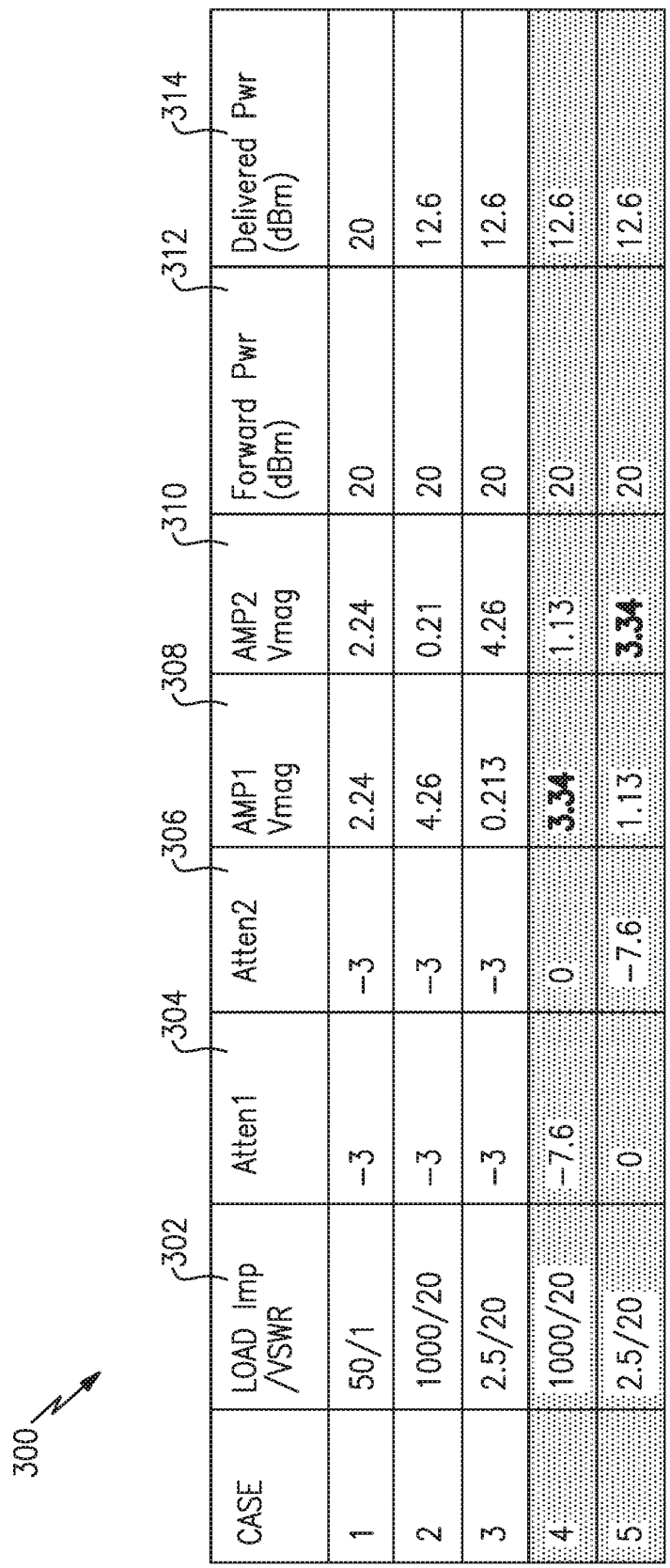
FIG. 3 is a table illustrating operation of the amplifier system of FIG. 2 according to aspects described herein.

FIG. 3 is an exemplary table illustrating operation of the amplifier system 200 in different embodiments. The table has a first column 302 including load impedance/VSWR ratios, a second column 304 including gain values (e.g., attenuation values) of the first amplifier 206, a third column 306 including gain values (e.g., attenuation values) of the second amplifier 208, a fourth column 308 including voltage levels across the first amplifier 206, a fifth column 310 including voltage levels across the second amplifier 208, a sixth column 312 including power levels of transmission signals provided by the output of the second phase shifter 216, and a seventh column 314 including the power levels of signals actually delivered to the load that is attached to the output 218.

In the first case shown in FIG. 3, the amplifier system 200 is operated in a matched condition (e.g., where the output impedance of the amplifier system 200 is matched with the load impedance of a corresponding antenna). In the matched condition, the VSWR of the system 200 is low, each amplifier 206, 208 is operated at the same gain, the voltage swing across each amplifier 206, 208 is the same, and the actual delivered power by the system 200 is equal to the desired transmitted power.

In the second case shown in FIG. 3, the amplifier system 200 is operated in a condition where the output impedance of the system 200 and the load impedance of a corresponding antenna (e.g. the antenna 140 shown in FIG. 1) are mismatched (e.g., due to the antenna being located on top of a metal surface). In the second case, the output impedance of the system 200 increases, the VSWR increases, and the controller 210 operates the amplifiers 206, 208 at the same gain. Accordingly, due to the phase difference between the first amplifier 206 and the second amplifier 208 (described above), the voltage swing across the first amplifier 206 increases and the voltage swing across the second amplifier 208 decreases. In such a condition, the actual output power provided by the system 200 also decreases.

In the third case shown in FIG. 3, the amplifier system 200 is operated in a condition where the output impedance of the system 200 and the load impedance of a corresponding antenna (e.g. the antenna 140 shown in FIG. 1) are mismatched (e.g., due to the antenna being located on top of a metal surface). In the third case, the output impedance of the system 200 decreases, the VSWR increases, and the controller 210 operates the amplifiers 206, 208 at the same gain. Accordingly, due to the phase difference between the first amplifier 206 and the second amplifier 208 (described above), the voltage swing across the second amplifier 208 increases and the voltage swing across the first amplifier 206 decreases. In such a condition, the actual output power provided by the system 200 also decreases.

In the fourth case shown in FIG. 3, the amplifier system 200 is operated in a condition where the output impedance of the system 200 and the load impedance of a corresponding antenna (e.g. the antenna 140 shown in FIG. 1) are mismatched (e.g., due to the antenna being located on top of a metal surface). In the fourth case, the output impedance of the system 200 increases and the VSWR increases. The fourth case is similar to the second case, described above, except that in the fourth case, in response to identifying a high voltage swing across the first amplifier 206 (due to the increased output impedance of the system 200), the controller adjusts the gain (i.e., increases the attenuation) of the first amplifier 206 to reduce output power of the first amplifier 206 and adjusts the gain (i.e., decreases the attenuation) of the second amplifier 208 to increase output power of the second amplifier 208. As shown in FIG. 3 in case 4, once the gains of the amplifiers 206, 208 are adjusted, the voltage swing across the first amplifier 206 is reduced and the voltage swing across the second amplifier 208 increases. The high voltage swing across the first amplifier 206 is reduced while maintaining the total output power of the system 200 at a desired level (e.g., the same level as in case 2) given the impedance mismatch.

In the fifth case shown in FIG. 3, the amplifier system 200 is operated in a condition where the output impedance of the system 200 and the load impedance of a corresponding antenna (e.g. the antenna 140 shown in FIG. 1) are mismatched (e.g., due to the antenna being located on top of a metal surface). In the fifth case, the output impedance of the system 200 decreases and the VSWR increases. The fifth case is similar to the third case, described above, except that in the fifth case, in response to identifying a high voltage swing across the second amplifier 208 (due to the increased output impedance of the system 200), the controller adjusts the gain (i.e., increases the attenuation) of the second amplifier 208 to reduce output power of the second amplifier 208 and adjusts the gain (i.e., decreases the attenuation) of the first amplifier 206 to increase output power of the first amplifier 206. As shown in FIG. 3 in case 5, once the gains of the amplifiers 206, 208 are adjusted, the voltage swing across the second amplifier 208 is reduced and the voltage swing across the first amplifier 206 increases. The high voltage swing across the second amplifier 208 is reduced while maintaining the total output power of the system 200 at a desired level (e.g., the same level as in case 3) given the impedance mismatch.

As described above, an amplifier system is described herein that applies asymmetric power distribution to account for undesired voltage swings. By applying asymmetric power distribution upon detecting a high voltage swing, the level of total output power of the amplifier system can be maintained at a desired level while also reducing voltage swing across the amplifier system. By reducing voltage swing across the amplifier system, damage of the amplifier system can be prevented.

As described above, the amplifier system includes phase shifters which are configured to both separate an RF signal into two signals and combine two amplified signals into an output RF signal; however, in other embodiments, one or both of the phase shifters can be replaced with another type of component that performs a similar function, such as a 2-input recombination amplifier.

As also described above, the signal output by the first amplifier 206 is 90 degrees out of phase with the signal output by the second amplifier 208; however, in other embodiments, the phase difference between the signals may be defined as any other appropriate value.

As described above, the controller of the system monitors the outputs of the amplifiers via peak detectors; however, in other embodiments the controller can monitor the outputs of the amplifiers via another type of sensor/detector. In another embodiment, the controller monitors the outputs of the amplifiers directly.

The amplifier system described above can be utilized in any type of device which includes power amplifiers subject to potential high voltage swings. For example, the amplifier system can be included in a wireless device.

Figure 4:
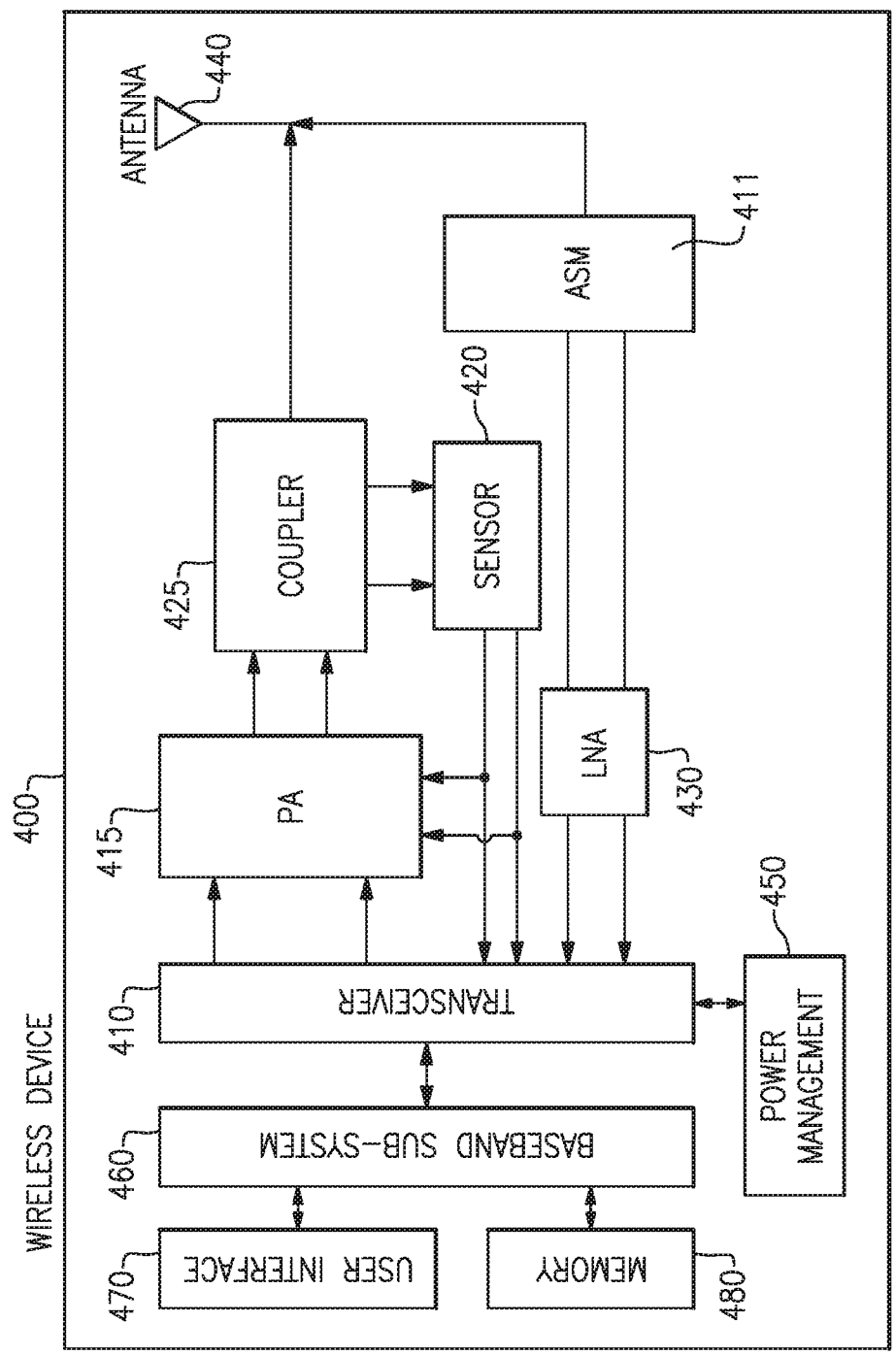
FIG. 4 is a block diagram of a wireless device including an amplifier system according to aspects described herein.

FIG. 4 is a block diagram of one embodiment of a wireless device 400 in which the amplifier system 200, as described above, can be implemented. The amplifier system 200 can be included in a power amplifier (PA) module 415, described in greater detail below. The wireless device 400 can be a cellular phone, smart phone, tablet, modem, communication network or any other portable or non-portable device configured for voice and/or data communication. The wireless device 400 can receive and transmit signals from the antenna 440. The wireless device 400 includes a transceiver 410 that is configured to generate signals for transmission and/or to process received signals. In some embodiments, transmission and reception functionalities can be implemented in separate components (e.g. a transmit module and a receiving module) or be implemented in the same module.

Signals generated for transmission are received by the power amplifier module 415, which amplifies the generated signals from the transceiver 410. As will be appreciated by those skilled in the art, the power amplifier module 415 can include one or more power amplifiers. The power amplifier module 415 can be used to amplify a wide variety of RF or other frequency-band transmission signals. For example, the power amplifier module 415 can receive an enable signal that can be used to pulse the output of the power amplifier to aid in transmitting a wireless local area network (WLAN) signal or any other suitable pulsed signal. The power amplifier module 415 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier module 415 and associated components including switches and the like can be fabricated on GaAs substrates using, for example, pHEMT or BiFET transistors, or on a Silicon substrate using CMOS transistors.

The power amplifier module 415 can include the amplifier system 200 which is configured to provide an RF output signal with desired output power, for example to the antenna 440, while reducing voltage swing across the amplifier system, as described above. The wireless device 400 also includes an LNA module 430, which may include one or more low noise amplifiers configured to amplify received signals.

The wireless device 400 also includes the coupler 425 having one or more coupler sections for measuring transmitted power signals from the power amplifier module 415 and for providing one or more coupled signals to a sensor module 420. The sensor module 420 can in turn send information to the transceiver 410 and/or directly to the power amplifier module 415 as feedback for making adjustments to regulate the power level of the power amplifier module 415. In this way the coupler 425 can be used to boost/decrease the power of a transmission signal having a relatively low/high power. It will be appreciated, however, that the coupler 425 can be used in a variety of other implementations.

For example, in certain embodiments in which the wireless device 400 is a mobile phone having a time division multiple access (TDMA) architecture, the coupler 425 can advantageously manage the amplification of an RF transmitted power signal from the power amplifier module 415. In a mobile phone having a time division multiple access (TDMA) architecture, such as those found in Global System for Mobile Communications (GSM) systems, the power amplifier module 415 can be used to shift power envelopes up and down within prescribed limits of power versus time. For instance, a particular mobile phone can be assigned a transmission time slot for a particular frequency channel. In this case the power amplifier module 415 can be employed to aid in regulating the power level one or more RF power signals over time, so as to prevent signal interference from transmission during an assigned receive time slot and to reduce power consumption. In such systems, the coupler 425 can be used to measure the power of a power amplifier output signal to aid in controlling the power amplifier module 415, as discussed above. The implementation shown in FIG. 4 is exemplary and non-limiting. For example, the implementation of FIG. 4 illustrates the coupler 425 being used in conjunction with a transmission of an RF signal, however, it will be appreciated that various examples of the coupler 425 discussed herein can also be used with received RF signals or other signals as well.

The wireless device 400 also includes the switching circuit 411 (which may also be called an ASM), which is configured to switch between different bands and/or modes.

As shown in FIG. 4, in certain embodiments the antenna 440 can both receive signals that are provided to the transceiver 410 via the switching circuit 411 and the LNA 430 and also transmit signals from the wireless device 400 via the transceiver 410, the power amplifier module 415, and the coupler 425. However, in other examples multiple antennas can be used for different modes of operation.

In the example illustrated in FIG. 4, the coupler 425 is shown positioned between the power amplifier module 415 and the antenna 440. However, as discussed above, the coupler 425 can be connected at various locations along transmit or receive signal path(s). Further, in the example shown in FIG. 4, the coupler 425 is shown as an individual component; however, in other examples, the coupler 425 can be combined with one or more other components of the wireless device 400. For example, in at least one embodiment, the wireless device 400 includes an integrated filter-coupler that combines the functionality of the coupler 425 and a filter. The wireless device 400 can include any number of filters which can be connected at various locations along transmit or receive signal path(s). Given the benefit of this disclosure, those skilled in the art will appreciate that a variety of other configurations and combinations of the components of the wireless device 400 may be implemented. According to one embodiment, the LNA 430 and the switching circuit 411 are integrated in a single module.

The wireless device 400 of FIG. 4 further includes a power management system 450 that is connected to the transceiver 410 and that manages the power for operation of the wireless device 400. The power management system 450 can also control the operation of a baseband sub-system 460 and other components of the wireless device 400. The power management system 450 can include, or can be connected to, a battery that supplies power for the various components of the wireless device 400. The power management system 450 can further include one or more processors or controllers that can control the transmission of signals and can also configure the coupler 425 based upon the frequency of the signals being transmitted, for example. In addition, the processor(s) or controller(s) of the power management system 450 may provide control signals to actuate switches, tune elements, or otherwise configure the coupler 425. In at least one embodiment, the processor(s) or controller(s) of the power management system 450 can also provide control signals to control the switching circuit 411 to operate in the transmit or receive mode. In at least one embodiment, the processor(s) or controller(s) of the power management system 450 can operate the power amplifier module 415 to reduce voltage swing across the amplifier system, as described above with respect to the controller 210 shown in FIG. 2.

In one embodiment, the baseband sub-system 460 is connected to a user interface 470 to facilitate various input and output of voice and/or data provided to and received from the user. The baseband sub-system 460 can also be connected to memory 480 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An amplifier system comprising:
an input configured to be coupled to a source and to receive an input signal from the source;
a first phase shifter configured to generate, based on the input signal, a first signal and a second signal, the second signal being out of phase with the first signal;
a first amplifier coupled to the first phase shifter and configured to apply a first gain to the first signal to produce a gain adjusted first signal;
a second amplifier coupled to the first phase shifter and configured to apply a second gain to the second signal to produce a gain adjusted second signal;
a second phase shifter coupled to the first amplifier and the second amplifier and configured to combine the gain adjusted first signal and the gain adjusted second signal to produce an output signal; and
a controller coupled to the first amplifier and the second amplifier and configured to identify a high voltage swing across the first amplifier and, in response to identifying the high voltage swing across the first amplifier, adjust the first gain of the first amplifier to reduce output power of the first amplifier and adjust the second gain of the second amplifier to increase output power of the second amplifier.

2. The amplifier system of claim 1 further comprising a first peak detector coupled to the first amplifier and configured to monitor voltage peaks of the gain adjusted first signal.

3. The amplifier system of claim 2 wherein the controller is further configured to identify the high voltage swing across the first amplifier based on the monitored voltage peaks of the gain adjusted first signal.

4. The amplifier system of claim 1 wherein the controller is further configured to identify a high voltage swing across the second amplifier and, in response to identifying the high voltage swing across the second amplifier, adjust the second gain of the second amplifier to reduce output power of the second amplifier and adjust the first gain of the first amplifier to increase output power of the first amplifier.

5. The amplifier system of claim 4 wherein the controller is further configured to adjust the first gain and the second gain to maintain a power level of the output signal at a substantially constant level.

6. The amplifier system of claim 5 further comprising:
a first peak detector coupled to the first amplifier and configured to monitor voltage peaks of the gain adjusted first signal, and
a second peak detector coupled to the second amplifier and configured to monitor voltage peaks of the gain adjusted second signal.

7. The amplifier system of claim 6 wherein the controller is further configured to identify the high voltage swing across the first amplifier based on the monitored voltage peaks of the gain adjusted first signal and to identify the high voltage swing across the second amplifier based on the monitored voltage peaks of the gain adjusted second signal.

8. A front-end module for a wireless device comprising:
an input port configured to receive an input Radio Frequency (RF) signal;
a power amplifier module coupled to the input port and including:
an input configured to be coupled to the input port and to receive the input RF signal;
a first phase shifter configured to generate, based on the input RF signal, a first signal and a second signal, the second signal being out of phase with the first signal;
a first amplifier coupled to the first phase shifter and configured to apply a first gain to the first signal to produce a gain adjusted first signal;
a second amplifier coupled to the first phase shifter and configured to apply a second gain to the second signal to produce a gain adjusted second signal;
a second phase shifter coupled to the first amplifier and the second amplifier and configured to combine the gain adjusted first signal with the gain adjusted second signal to produce a first RF signal; and
a controller coupled to the first amplifier and the second amplifier and configured to identify a high voltage swing across the first amplifier and, in response to identifying the high voltage swing across the first amplifier, adjust the first gain of the first amplifier to reduce output power of the first amplifier and adjust the second gain of the second amplifier to increase output power of the second amplifier; and
an output configured to be coupled to an antenna, to receive a second RF signal from the antenna in a receive mode of operation, and to transmit the first RF signal from the power amplifier module to the antenna in a transmit mode of operation.

9. The front-end module of claim 8 further comprising a first peak detector coupled to the first amplifier and configured to monitor voltage peaks of the gain adjusted first signal.

10. The front-end module of claim 9 wherein the controller is further configured to identify the high voltage swing across the first amplifier based on the monitored voltage peaks of the gain adjusted first signal.

11. The front-end module of claim 8 wherein the controller is further configured to identify a high voltage swing across the second amplifier and, in response to identifying the high voltage swing across the second amplifier, adjust the second gain of the second amplifier to reduce output power of the second amplifier and adjust the first gain of the first amplifier to increase output power of the first amplifier.

12. The front-end module of claim 11 wherein the controller is further configured to adjust the first gain and the second gain to maintain a power level of the output signal at a substantially constant level.

13. The front-end module of claim 12 further comprising:
a first peak detector coupled to the first amplifier and configured to monitor voltage peaks of the gain adjusted first signal, and
a second peak detector coupled to the second amplifier and configured to monitor voltage peaks of the gain adjusted second signal.

14. The front-end module of claim 13 wherein the controller is further configured to identify the high voltage swing across the first amplifier based on the monitored voltage peaks of the gain adjusted first signal and to identify the high voltage swing across the second amplifier based on the monitored voltage peaks of the gain adjusted second signal.

15. A wireless device comprising:
a transceiver configured to produce a transmit signal;
a power amplifier module coupled to the transceiver and including:
an input configured to be coupled to the transceiver and to receive the transmit signal;
a first phase shifter configured to generate, based on the transmit signal, a first signal and a second signal, the second signal being out of phase with the first signal;
a first amplifier coupled to the first phase shifter and configured to apply a first gain to the first signal to produce a gain adjusted first signal;
a second amplifier coupled to the first phase shifter and configured to apply a second gain to the second signal to produce a gain adjusted second signal;
a second phase shifter coupled to the first amplifier and the second amplifier and configured to combine the gain adjusted first signal with the gain adjusted second signal to produce a first RF signal; and
a controller coupled to the first amplifier and the second amplifier and configured to identify a high voltage swing across the first amplifier and, in response to identifying the high voltage swing across the first amplifier, adjust the first gain of the first amplifier to reduce output power of the first amplifier and adjust the second gain of the second amplifier to increase output power of the second amplifier; and
an antenna configured to receive a second RF signal in a receive mode of operation and to transmit the first RF signal from the power amplifier in a transmit mode of operation.

16. The wireless device of claim 15 further comprising a first peak detector coupled to the first amplifier and configured to monitor voltage peaks of the gain adjusted first signal, and the controller further configured to identify the high voltage swing across the first amplifier based on the monitored voltage peaks of the gain adjusted first signal.

17. The wireless device of claim 15 wherein the controller is further configured to identify a high voltage swing across the second amplifier and, in response to identifying the high voltage swing across the second amplifier, adjust the second gain of the second amplifier to reduce output power of the second amplifier and adjust the first gain of the first amplifier to increase output power of the first amplifier.

18. The wireless device of claim 17 wherein the controller is further configured to adjust the first gain and the second gain to maintain a power level of the output signal at a substantially constant level.

19. The wireless device of claim 18 further comprising:
a first peak detector coupled to the first amplifier and configured to monitor voltage peaks of the gain adjusted first signal, and
a second peak detector coupled to the second amplifier and configured to monitor voltage peaks of the gain adjusted second signal.

20. The wireless device of claim 19 wherein the controller is further configured to identify the high voltage swing across the first amplifier based on the monitored voltage peaks of the gain adjusted first signal and to identify the high voltage swing across the second amplifier based on the monitored voltage peaks of the gain adjusted second signal.

* * * * *